Figure 1:
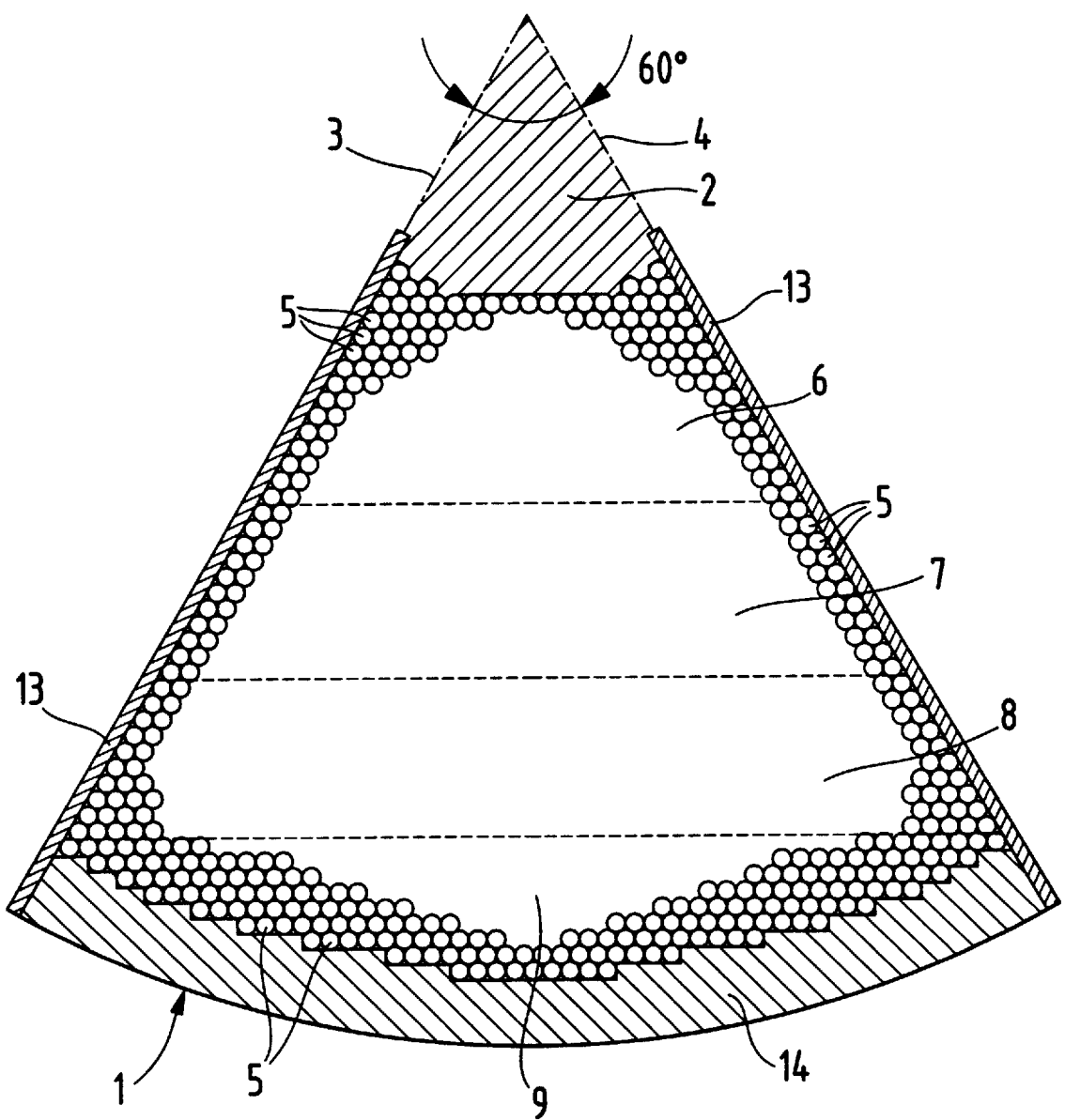

United States Patent
Teuho

[11] Patent Number: 6,038,759
[45] Date of Patent: *Mar. 21, 2000

[54] METHOD OF PRODUCING A SUPERCONDUCTOR BILLET

[75] Inventor: Juhani Teuho, Pori, Finland

[73] Assignee: Outokumpu Copper OY, Finland

[*] Notice: This patent issued on a continued prosecution application filed under 37 CFR 1.53(d), and is subject to the twenty year patent term provisions of 35 U.S.C. 154(a)(2).

[21] Appl. No.: 08/665,384

[22] Filed: Jun. 18, 1996

[30] Foreign Application Priority Data

Jun. 21, 1995 [FI] Finland ..................... 953069

[51] Int. Cl.⁷ ..................... H01L 39/24
[52] U.S. Cl. ..................... 29/599; 505/917; 505/929
[58] Field of Search ..................... 29/599; 505/917, 505/928, 929, 930

[56] References Cited

U.S. PATENT DOCUMENTS

| | | | |
|---|---|---|---|
| 3,277,564 | 10/1966 | Webber et al. | 29/599 X |
| 3,472,944 | 10/1969 | Morton et al. | 29/599 X |
| 3,829,964 | 8/1974 | Critchlow et al. | 29/599 |
| 3,996,661 | 12/1976 | Ziegler et al. | 29/599 |
| 4,327,244 | 4/1982 | Horvath et al. | 29/599 X |
| 4,777,710 | 10/1988 | Hunt | 29/599 X |
| 4,863,804 | 9/1989 | Whitlow et al. | 29/599 X |
| 4,959,279 | 9/1990 | Tanaka et al. | 29/599 X |
| 5,088,183 | 2/1992 | Kanithi | 29/599 |
| 5,419,974 | 5/1995 | Walters et al. | 29/599 X |

*Primary Examiner*—Joseph M. Gorski
*Attorney, Agent, or Firm*—Morgan & Finnegan, L.L.P.

[57] ABSTRACT

The invention relates to a method for producing a superconductor billet, in which superconductor billet there are used superconductor rods with a circular cross-section, and which superconductor billet can be extruded into a superconductor in a single-step extrusion process. According to the invention, the superconductor billet (12) is formed of interconnected blocks (1), into which blocks there are packed monofilament superconductor rods (5) with a circular cross-section.

5 Claims, 3 Drawing Sheets

METHOD OF PRODUCING A SUPERCONDUCTOR BILLET

The present invention relates to a method for improving the packing in the assembly production of superconductor billets, when the superconductor billet is compiled of a large amount of superconductor rods.

BACKGROUND OF THE INVENTION

In applications such as accelerator magnets, fine filament superconductors are needed in order to minimize distortion caused in the magnetic field by magnetization. The magnetization is dependent on the critical current density, the ratio of the matrix to the superconductor and the diameter of the superconductor filament. Generally the ratio of the matrix to the superconductor is determined as a certain constant value, which is derived from the stability of the wire. In order to cut the production costs of the wire, the tendency is to minimize the amount of the expensive superconductor material. Therefore the critical current density must be as high as possible, but simultaneously—owing to magnetization—the diameter of the superconductor filament must be as small as possible. However, a short diameter of the filament means that the number of the super-conductor filaments must be increased in order to maintain the properties of the superconductor. Usually such superconductors are produced by multi-step extrusion, in which case the final product contains heterogeneous filament areas resulting from the intermediate extrusion steps. In a two-step or three-step extrusion method, there are created several local irregularities in the matrix to superconductor ratio. Moreover, each extrusion step is expensive, and the separate extrusion steps weaken the properties of the superconductor as well as increase the waste of the material.

In order to reduce the extrusion steps, there are developed superconductor packing methods, where a superconductor billet containing several thousands of superconductor rods can be compiled so that the extrusion of the superconductor billet is carried out in a one-step extrusion. In the publications Kreilick T. S., Gregory E., Wong J: The design and fabrication of strand for SSC magnet applications, ICEC 11, Berlin 1986, and Geometric considerations in the design and fabrication of multifilamentary superconducting composites, IEEE Transactions on magnetics, Vol. MAG-23, No 2, 1987, there is described a method where round superconductor rods are packed directly into a copper can. In the publication Kanithi H. C., Valaris P., Zeitlin B. A: A novel approach to make fine filament superconductor, Supercollider 4, Edited by Nonte J., 1992, the superconductor rods are packed in a copper tube. This same production of superconductor billets also is described in the U.S. Pat. No. 5,088,183, introducing a method for producing a superconductor made of a large amount of round monofilament rods. In this method, a multiple of round monofilament rods is compiled inside a thin-wall hexagonal tube, whereafter several similarly compiled hexagonal tubes are assembled inside the extrusion can, and the areas that remain open are packed with single rods. The said superconductor billet is further compacted, extruded and drawn to the desired wire size. In the packing methods described above, at least part of the rods remain without support, which as such makes it difficult to create an advantageous superconductor billet.

SUMMARY OF THE INVENTION

The object of the present invention is to eliminate some of the drawbacks of the prior art and to achieve an improved method for producing superconductor billets, so that in the said production process, there can advantageously be used such superconductor rods that are essentially round in cross-section and are packed so that in the lengthwise direction the superconductor rods are supported to at least two surfaces adjacent to the said superconductor rod, and that each single rod keeps its exact place throughout the whole length, also in the lengthwise direction. When compiled, these packing blocks together form a desired cross-sectional surface for the superconductor billet. The essential novel invention are apparent from the appended claims.

According to the invention, the desired cross-sectional surface of the superconductor billet is achieved by combining the blocks. Advantageously the blocks are created so that part of them is formed of a closed metal element, which is part of the central metal of the superconductor billet. Advantageously the blocks can have an essentially similar shape in cross-section, but the blocks can also be different in shape; however, blocks of the same shape are located symmetrically with respect to the central point of the cross-sectional surface of the superconductor billet. The rest of the blocks, i.e. the part other than the central metal part, is manufactured of metal profiles, advantageously copper profiles, inside which the 1.0–3.0 mm thick superconductor rods of the superconductor billet are packed so that a single rod can in the lengthwise direction of the rod be supported against at least two surfaces adjacent to the rod. When assembling the blocks, in between two blocks there is advantageously placed at least one thin metal sheet, with a thickness of 0.5–2 mm, advantageously 1.0–1.5 mm, such as a copper sheet. By means of a thin metal sheet, disadvantages caused by irregularities in the matrix to supercondustor ratio are reduced.

By means of the method of the present invention, a remarkable amount—advantageously thousands of superconductor rods—are packed in a way that is economical as for expenses. Advantageously the single blocks of the superconductor billet are packed at different times, so that the size of the blocks can be increased in comparison to ordinary packing of conductors and in this way also the number of the superconductor rods in the blocks can be increased. The cross-sectional area of the superconductor billet will also in this way enlarge and then the current density through the conductor can also be increased.

According to the invention, the blocks of the superconductor billet can further be perpendicularly to the radius, divided into areas where the superconductor rods are in the lengthwise direction packed on different levels with respect to each other. When the given blocks are in the lengthwise direction packed radially area by area on different levels, the material waste is advantageously reduced.

In the method of the invention, the employed superconductor rods are advantageously circular in cross-section, so that the said rods are supported against each other or to the block wall, in which case each single rod is in the lengthwise direction supported on at least two adjacent surfaces. Thus single superconductor rods advantageously remain in place in the various stages of processing the superconductor.

The essentially compact, packed arrangement created according to the method of the invention is maintained by determining the block dimensions on the basis of the diameter of the superconductor rod so accurately, that dislocations cannot take place in the rods. Consequently, the filaments in the final product are regular in shape, and necking—which is common in fine filaments—can be avoided. As a result, other electric properties of the created superconductor, such as the "n" value, and critical current density, can also be improved.

According to the invention, the employed packing blocks of the superconductor rods are advantageously essentially regular polygons. In order to pack a superconductor billet which is essentially circular in cross-section, the acute angle of the blocks in relation to the central point can advantageously vary from 30 to 180 degrees. For instance, when the acute angle of the blocks is 60 degrees, there are needed six blocks in order to advantageously create a superconductor billet with an essentially circular cross-section. When the acute angle of the blocks in relation to the central point is 180 degrees, there are needed two blocks, and when the acute angle of the blocks is 90 degrees, the number of required blocks is four. The number of blocks can be anything up to twelve, in which case the acute angle of each block in relation to the central point is 30 degrees—in the case of a circular cross-section.

BRIEF DESCRIPTION OF THE INVENTION

Figure 2:
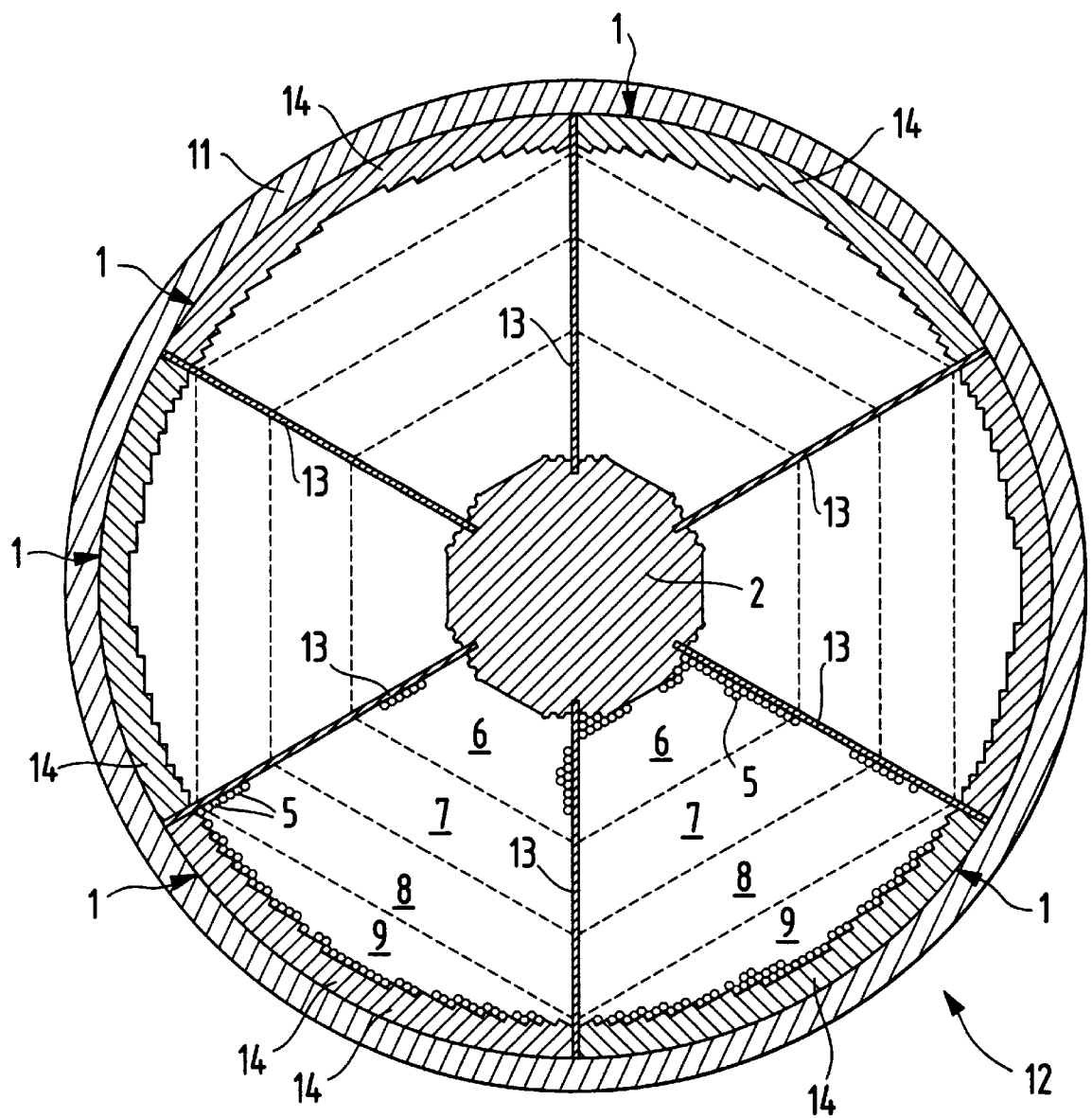
Figure 3:
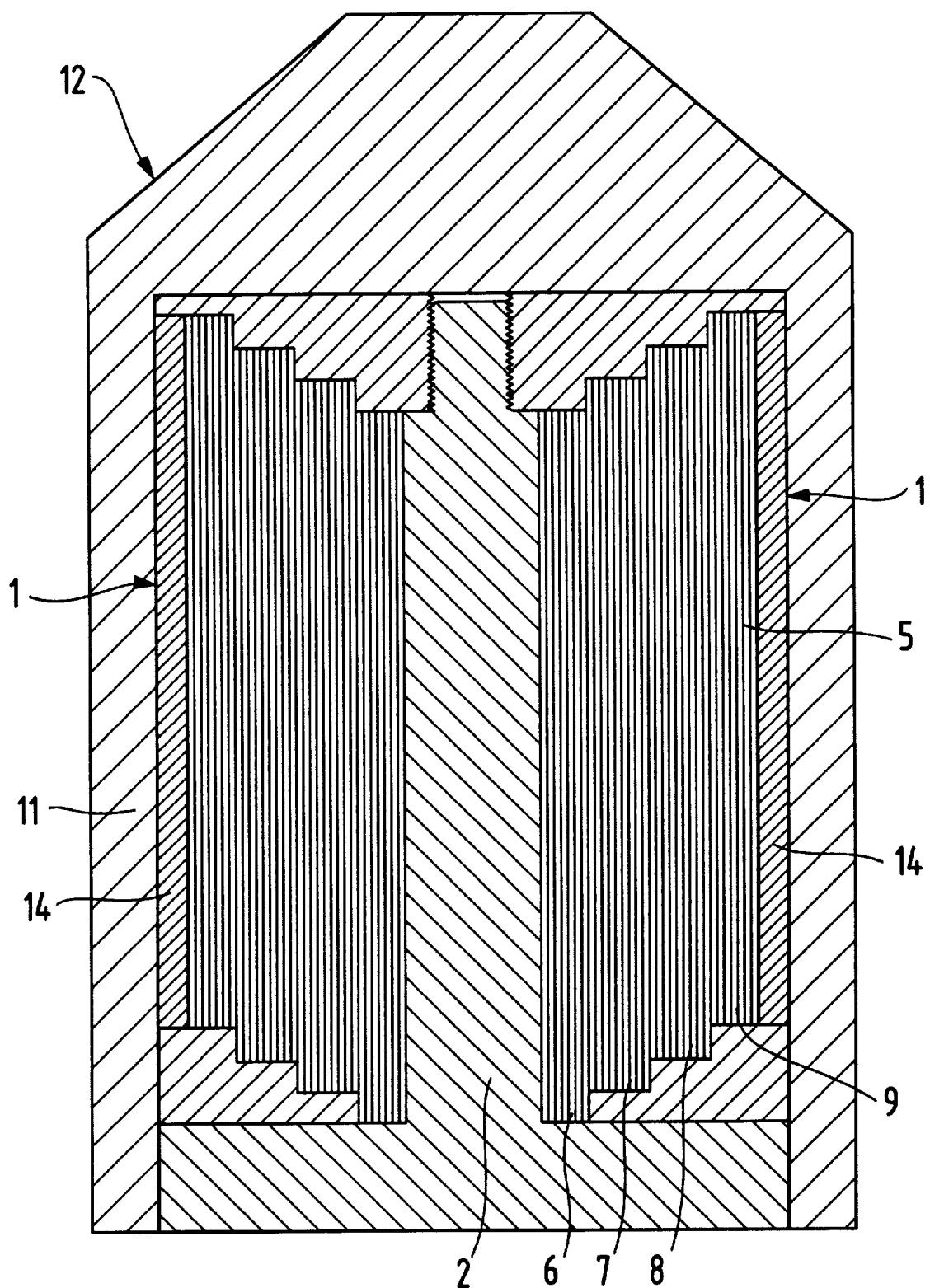

The invention is explained in more detail below, with reference to the appended drawings where FIG. 1 shows a cross-section of a superconductor billet block connected to a preferred embodiment of the invention, FIG. 2 shows a cross-section of the superconductor billet of FIG. 1, and FIG. 3 shows a lengthwise section of the superconductor billet block illustrated in FIG. 1.

According to FIG. 1, the block 1 of the superconductor billet is formed of a main part 2 made of copper, which part belongs to the central copper of the superconductor billet. The lines 3 and 4 connected to the main part 2 of the block form an angle of 60 degrees with respect to each other. In other parts, the block 1 is packed essentially full of round, superconductor rods 5 with a circular cross-section; in the drawing, these are illustrated only in the vicinity of the walls of the block 1. Moreover, as for its part filled with superconductor rods, i.e. part 5, the block 1 is perpendicularly to the radius divided with dotted lines into areas 6, 7, 8 and 9, which areas are in the lengthwise direction arranged on different levels, as is illustrated in FIG. 3. With reference to FIG. 3, the copper casing 11 of the superconductor billet 12 includes an uppermost surface 20, an uppermost edge 22 and a tapered surface 24. Block 1 contains members 26 and 28 having a plurality of step-shaped surfaces 27 and 29, respectively, for retaining the superconductor rods 5 at different axial locations along the longitudinal axis of the central billet core 2 within preselected areas 6, 7, 8, and 9. Areas 6, 7, 8 and 9, respectively, are spaced radially outward preselected distances from the longitudinal axis of the central billet core 2, Area 6 is closest to the longitudinal axis and area 9 is the furthest away from the longitudinal axis with the innermost area 6 being contiguous to the next innermost area 7 and likewise out to the outermost area 9. Areas 6, 7, 8, and 9 are axially staggered with respect to each other. The rod ends situated within area 6, 7, 8 and 9, respectively, are axially staggered so that the rod ends within area 6 are furthest from uppermost surface 20 and the rod ends within area 9 are closest thereto.

Referring to FIGS. 1 and 2, the outer surface of central billet core 2 that forms part of each block 1 has a plurality of axially extending grooves for receiving and supporting superconductor rods 5 placed in contact therewith. The inner surface of each profile 14 that forms part of each block 1 is shaped with a plurality of longitudinally extending, step-shaped surfaces for receiving and supporting superconductor rods placed in contact therewith.

In FIG. 2, the block 1 according to FIG. 1 is compiled together with blocks having an essentially similar shape in order to form inside the copper casing 11 a superconductor billet 12 with a desired shape. The blocks 1 are separated from each other, at least as regards the area 5 filled with superconductor rods, by means of thin metal sheet, such as copper sheet 13. In addition, in the space between the copper casing 11 and the block 1, there is installed at least one single-element copper profile 14 in order to provide an advantageous support in between the block 1 and the casing 11.

I claim:

1. A method of producing a superconductor billet, comprising the steps of:

providing a copper core having a longitudinal axis and an outer surface defining a plurality of longitudinally extending grooves;

providing a plurality of copper sheets each having a first side and an oppositely facing second side;

providing a plurality of copper arcuate segments each having a convex surface, a concave surface defining a plurality of longitudinally extending step-shaped surfaces, and a first end face and a second end face interconnecting the convex surface to the concave surface;

providing a copper casing having an inner circumferential surface;

providing a plurality of substantially identical cylindrical superconducting rods each having an outer circumferential surface, a first axial end, a second axial end, and a longitudinal axis;

attaching from two to six of said sheets to said core, such that said from two to six sheets extend radially from said core and define at least one pair of adjacent sheets, with the first side of one sheet of each pair of the at least one pair circumferentially facing the second side of the second sheet of said each pair, respectively, and the second side of the one sheet of said each pair circumferentially facing the first side of the second sheet of said each pair, respectively;

positioning one of said arcuate segments against each of said first side and said second side of each of said sheets attached to said core, respectively, such that one of said arcuate segments is positioned between every two sheets defining a pair of said at least one pair, respectively, whereby said first end face contacts said first side of one sheet of the pair, said second end face contacts said second side of the second sheet of the pair, said concave surface is spaced from and faces towards said core, and said convex surfaces define in combination an essentially continuous circle, such that a cavity is formed between every two immediately circumferentially adjacent sheets, wherein each of said cavities is defined by a combination of a portion of said outer surface of said core having some of said longitudinally extending grooves, said first side of one of said sheets attached to the core, said second side of a immediately circumferentially adjacent sheet attached to the core, and said concave surface of said arcuate segment positioned against and between the one sheet and its immediately circumferentially adjacent second sheet;

close packing said cylindrical superconducting rods into each of said cavities, such that the longitudinal axis of each of said rods is parallel with the longitudinal axis of said core, each of said rods is supported by and in contact with at least two immediately adjacent rods, some of said rods are received within said longitudinally extending grooves and supported by said core, and other of said rods are supported individually by said longitudinally extending step-shaped surfaces, whereby a unit is formed that comprises said core, said sheets attached to said core, said arcuate segments positioned between and in contact with every two immediately circumferientially adjacent sheets attached to said core, and said cylindrical superconducting rods packed into said cavities; and surrounding said unit with said copper casing, whereby the inner circumferential surface of said copper tube is in contact with the convex surface of each of said arcuate segments of said unit.

2. The method according to claim 1, wherein the step of providing a copper casing includes providing the copper casing with a tapered axial end.

3. The method according to claim 1, wherein the step of providing a copper core includes providing the copper core with an axial first end extending radially outwardly from said outer surface of said core and an axial second end extending radially outwardly from said outer surface of said core, with the first axial end defining a plurality of steps that incrementally increase in distance axially away from the second axial end in a radial direction from the longitudinal axis of said core towards said concave surface of a corresponding one of said arcuate segments positioned between and in contact with two immediately circumferentially adjacent sheets attached to said core, with the second axial end defining a plurality of steps that incrementally decrease in axial distance away from the first axial end in a radial end direction from the longitudinal axis of said core towards said concave surface of a corresponding one of said arcuate segments positioned between and in contact with two immediately circumferentially adjacent sheets attached to said core, and with the steps at the first axial end facing then steps at the second axial end, and wherein the step of close packing includes positioning said first axial end of each of said superconducting rods against said steps at said first axial end and positioning said second axial end of each of said superconducting rods against said steps at said second axial end.

4. The method of claim 1, wherein said attaching and positioning steps include attaching said sheets to said core and positioning said arcuate segments against each of said first side and said second side of said sheets attached to said core such that the cavities formed are symmetrical with respect to one another relative to said longitudinal of said core.

5. A method of producing a superconductor billet, comprising the steps of:

providing a copper core having a longitudinal axis and an outer surface defining a plurality of longitudinally extending grooves;

providing a plurality of copper sheets each having a first side and an oppositely facing second side;

providing a plurality of copper arcuate segments each having a convex surface, a concave surface defining a plurality of longitudinally extending step-shaped surfaces, and a first end face and a second end face interconnecting the convex surface to the concave surface;

providing a copper casing having an inner circumferential surface;

providing a plurality of substantially identical cylindrical superconducting rods each having an outer circumferential surface, a first axial end, a second axial end, and a longitudinal axis;

attaching from two to six of said sheets to said core, such that said from two to six sheets extend radially from said core and define at least one pair of adjacent sheets, with the first side of one sheet of each pair of the at least one pair circumferentially facing the second side of the second sheet of said each pair, respectively, and the second side of the one sheet of said each pair circumferentially facing the first side of the second sheet of said each pair, respectively;

positioning one of said arcuate segments against each of said first side and said second side of each of said sheets attached to said core, respectively, such that one of said arcuate segments is positioned between every two sheets defining a pair of said at least one pair, respectively, whereby said first end face contacts said first side of one sheet of the pair, said second end face contacts said second side of the second sheet of the pair, said concave surface is spaced from and faces towards said core, and said convex surfaces define in combination an essentially continuous circle, such that a cavity is formed between every two immediately circumferentially adjacent sheets, wherein each of said cavities is defined by a combination of a portion of said outer surface of said core having some of said longitudinally extending grooves, said first side of one of said sheets attached to the core, said second side of a immediately circumferentially adjacent sheet attached to the core, and said concave surface of said arcuate segment positioned against and between the one sheet and its immediately circumferentially adjacent second sheet;

close packing said cylindrical superconducting rods into each of said cavities, such that the longitudinal axis of each of said rods is parallel with the longitudinal axis of said core, each of said rods is supported by and in contact with at least two immediately adjacent rods, some of said rods are received within said longitudinally extending grooves and supported by said core, and other of said rods are supported individually by said longitudinally extending step-shaped surfaces, whereby a unit is formed that comprises said core, said sheets attached to said core, said arcuate segments positioned between and in contact with every two immediately cirucmferientially adjacent sheets attached to said core, and said cylindrical superconducting rods packed into said cavities;

surrounding said unit with said copper casing, whereby the inner circumferential surface of said copper tube is in contact with the convex surface of each of said arcuate segments of said unit, and thereby forming a covered unit; and extruding said covered unit in a single extrusion step.

\* \* \* \* \*

UNITED STATES PATENT AND TRADEMARK OFFICE
CERTIFICATE OF CORRECTION

PATENT NO. : 6,038,759

DATED : March 21, 2000

INVENTOR(S) : JUHANI TEUHO

It is certified that error appears in the above-identified patent and that said Letters Patent is hereby corrected as shown below:

Column 2, line 10, after "novel" and before "invention" insert --features of the--.

Column 3, line 19, in the title, change "INVENTION" to --DRAWINGS--.

Signed and Sealed this

Twenty-third Day of January, 2001

Attest:

Q. TODD DICKINSON

Attesting Officer

Commissioner of Patents and Trademarks